MAJORITY CARRIER CHANNEL DEVICE USING HETEROJUNCTIONS

Filed Dec. 30, 1963

INVENTORS
PIETER BALK
MANFRED H. PILKUHN
BY John F. Ohland Jr.
ATTORNEY

United States Patent Office 3,273,030
Patented Sept. 13, 1966

3,273,030
MAJORITY CARRIER CHANNEL DEVICE USING HETEROJUNCTIONS

Pieter Balk, Katonah, and Manfred H. Pilkuhn, Mahopac, N.Y., assignors to International Business Machines Corporation, New York, N.Y., a corporation of New York Filed Dec. 30, 1963, Ser. No. 334,517
10 Claims. (Cl. 317—235)

This invention relates to semiconductor devices and, more particularly, to a novel unipolar field effect device.

A description of a basic unipolar device may be had by reference to the article by W. Shockley "A Unipolar 'Field Effect' Transistor" in the Proceedings of the IRE, November 1952, pages 1365–1376. This device is called unipolar because the "working current" carried by the device is by means of one type of carrier, that is, either by holes or electrons. This contrasts radically with the more conventional transistor NPN or PNP configuration wherein a current flow involves carriers of both signs, that is, both holes and electrons.

The device described in the aforesaid article by W. Shockley is operated in such a manner that majority carriers travel from a source electrode through the semiconductor body to a drain electrode. At one point on the semiconductor body, a layer of opposite conductivity type to the body is formed which acts as the control or gate of the device. By application of an appropriate bias to the gate, the conduction of the channel existing between the source and drain electrodes is modulated. The channel width is affected by the application of bias to the gate because bias will change the width of the depletion layer which is associated with the pn junction defined by the control or gate in contact with the body. If the reverse bias voltage is made great enough, the depletion layer at the aforesaid pn junction becomes so wide as to pinch off the current flow through the channel.

The present invention differs from the unipolar field effect transistor described in the Shockley article in that the device of the present invention relies on the fact that a channel formed at the interface between semiconductors of different band gaps can be advantageously utilized as the conducting path in a field effect device.

Accordingly, it is a primary object of the present invention to provide a unipolar field effect device based upon the principle of the modulation of the interfacial potential at a heterojunction.

Another object is to alter the conductance of a field effect device channel by the modulation of the interfacial potential at a heterojunction.

The above objects are fulfilled by a broad feature of the present invention in that, when a heterojunction is formed involving two semiconductor materials having different band gaps, an inversion layer is created at the interface. By application of proper bias voltages to the different semiconductor materials, the conductivity of the inversion layer at the interface is modified and, thus, the total conductance of the channel defined by the inversion layer is significantly altered.

Certain properties of heterojunctions have been described heretofore and a description may be had to an article by R. L. Anderson in Solid State Electronics, vol. 5, 1962, page 341. As explained in the above article, a heterojunction constituted of the semiconductor materials Ge and GaAs, even though the materials may be of the same conductivity type, generally has potential barriers due to band edge discontinuities. This property will be exploited as explained hereinafter.

An advantage which the device of the present invention possesses, and which distinguishes it from the device described in the Shockley article referred to above, is that a well-defined channel of uniform thickness is readily obtained without the necessity of resorting to diffusion techniques which are difficult to control. Further, as compared with the later-developed so-called surface field effect device, the device of the present invention does not require the formation of a very thin oxide layer, or other insulating layer, with a high breakdown strength.

Although reference has been made, and will be made hereinafter, to a Ge-GaAs heterojunction, it should be borne in mind that other suitable semiconductors having appropriately matched lattice parameters may be utilized to take special advantage of their unique capabilities following the basic teaching disclosed herein.

The foregoing and other objects, features and advantages of the invention will be apparent from the following more particular description of preferred embodiments of the invention, as illustrated in the accompanying drawings:

Figure 1:
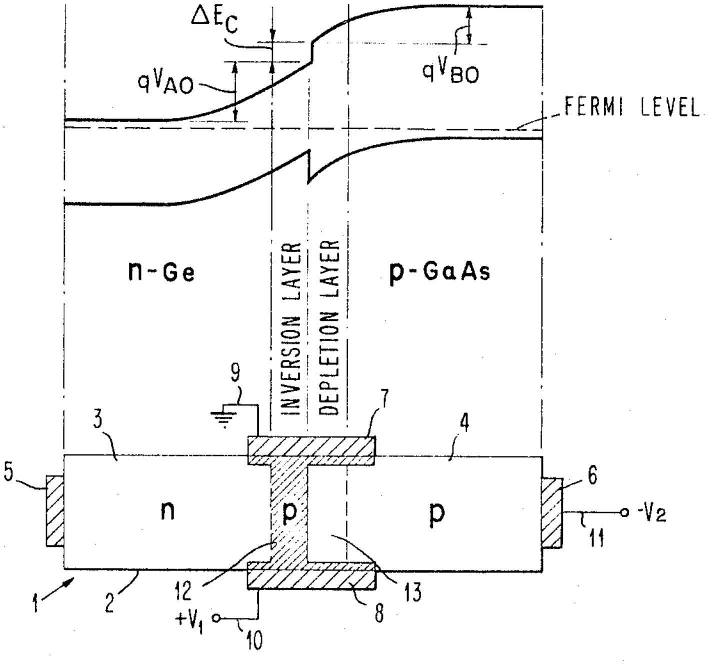
FIGURE 1 is a schematic diagram illustrating the principles of the device of the present invention with a correlated energy band diagram.

Referring now to FIGURE 1, there is shown a semiconductor device which comprises a semiconductor body 2 having two regions 3 and 4 of predetermined conductivity type. In this particular instance, the region 3 is of n type germanium and the region 4 is of p type GaAs, the conductivity type being obtained by appropriate doping. Ohmic contacts 5 and 6 are provided to regions 3 and 4, respectively. Also, contacts 7 and 8 on opposed surfaces of the body are rectifying to both of the regions 3 and 4. Contact 7 is connected to ground via conductor 9. Ohmic contact 6 is shown connected to a source of variable potential $-V_2$ by conductor 11. At the interface between the two materials, germanium and gallium arsenide, of which the regions 3 and 4 are constituted, an inversion layer 12 is created. Also, a depletion layer 13 is shown in FIGURE 1. In effect, a pp junction exists between the inversion layer 12 and the gallium arsenide region. This inversion layer 12 exists because of the nature of the band structure. Thus, referring to the energy band diagram above the device 1, it will be appreciated, looking from left to right, that at first the Fermi level is situated very close to the conduction band and as the interface is approached the Fermi level appears equidistant between the valence and conduction bands and, thereafter, as one proceeds to the right, the Fermi level appears closer to the valence band which, of course, means that in the inversion layer 12 carriers of opposite sign to those in the bulk of region 3 predominate. The contacts 7 and 8 to the structure of FIGURE 1 are made ohmic to the inversion layer 12 of p type but are rectifying to the bulk of the semiconductor materials. Contacts 5 and 6 are made ohmic to the respective regions 3 and 4.

A complete current path exists between the contacts 7 and 8 which may be denominated the source and drain, in conformity with field effect nomenclature. Thus, with $+V_1$ applied to contact 8 there is a flow of holes in layer 12 due to the difference in potential between contacts 7 and 8.

The conductivity of the inversion layer 12 is substantially modified by the application of the biasing potential $-V_2$ to the ohmic contact 6. Thus, in this case, region 4 of p conductivity gallium arsenide will serve as the gate for the field effect device 1. The application of this bias $-V_2$ results in a change in the charge distribution at the interface and this can be understood by reference to the energy band diagram. Thus, the bands are further bent and one-half of the diagram is shifted to correspond with the application of the bias $-V_2$.

It will be noted that, if desired, a source of potential may also be applied to the ohmic contact 5 provided on region 3.

For the formation of the structure of FIGURE 1, it will be understood that various techniques for fabricating semiconductor structures may be employed. For example, one such technique known as vapor growth may be utilized, for example, the n type germanium region 3 is epitaxially grown from the vapor phase on the p type conductivity region 4 of monocrystalline gallium arsenide. Of course, it will be appreciated by those skilled in the art that the structure of FIGURE 1 may be realized by reversing the roles of the semiconductors and/or reversing the role of the monocrystalline substrate and the deposit; that is, the semiconductor gallium arsenide is grown on the region 3 of n conductivity-type germanium.

For tailoring the inversion layer, the relative doping of the respective regions 3 and 4 must be calculated. To create the desired inversion layer 12 one can use the following expressions.

$$(1)\quad qV_{AO}+qV_{BO}+\Delta E_C=E_{gB}\text{ (approximately)}$$

$$(2)\quad \frac{V_{AO}}{V_{BO}}=\frac{K_BN_B}{K_AN_A}$$

$$(3)\quad qV_{AO}\geq 1/2E_{gA}$$

where $V_{AO}$ is the built-in voltage in semiconductor A; $V_{BO}$ is the built-in voltage in semiconductor B; $\Delta E_C$ the conduction band discontinuity; $E_{gA}$ and $E_{gB}$ represents the band gaps for semiconductors A and B. Also, $K_A$ and $K_B$ are the respective dielectric constants for the materials A and B; $N_A$ and $N_B$ are the doping levels for the respective semiconductors.

Combining the above expressions results in the final expression for relative doping:

$$(4)\quad \frac{N_A}{N_B}<\frac{K_B}{K_A}\frac{(2E_{gB}-E_{gA}-2\Delta E_C)}{E_{gA}}$$

Figure 2:
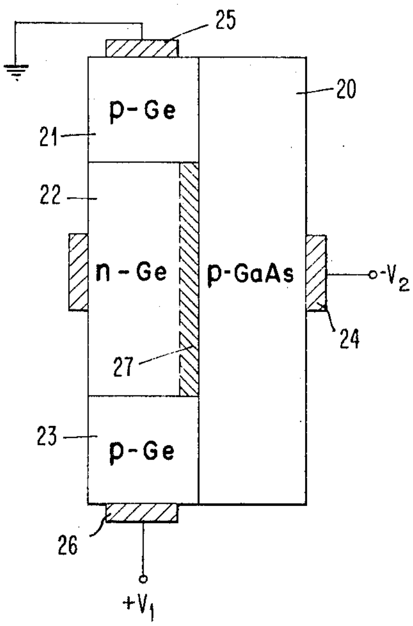
FIGURE 2 is a diagram of one embodiment of the device.

Referring now to FIGURE 2, a realization of the basic schematic structure of FIGURE 1 is illustrated. A region 20 typically of p type GaAs is in immediate contiguity wth a succession of regions of germanium, namely regions 21, 22 and 23. To region 20 an ohmic contact 24 is affixed and ohmic contacts 25 and 26 are attached respectively to regions 21 and 23. The regions 21, 22 and 23 are respectively of p conductivity type, n conductivity type and p conductivity type. In region 22, an inversion layer 27 exists at the interface of the regions 20 of p type GaAs and the region 22 of n type germanium. The structure as shown in FIGURE 2 simplifies contacting the inversion layer.

Figure 3:
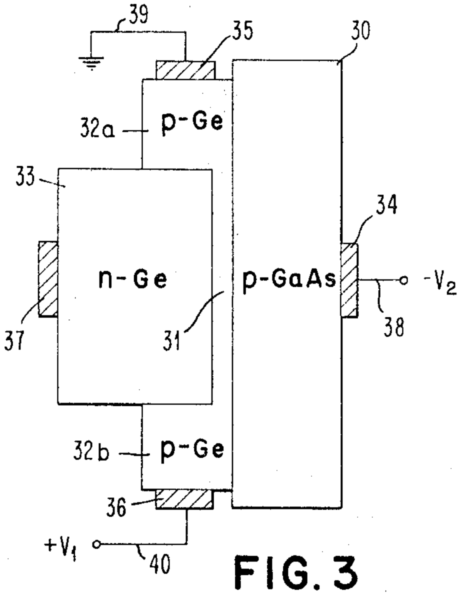
FIGURE 3 is a diagram of another embodiment of the device.

Referring now to FIGURE 3, a third embodiment of the present invention is shown in which reliance is not placed on the inherent formation of an inversion layer due to the nature of the heterojunction. Rather, a wafer or body 30 of gallium arsenide is selected and a thin p type layer of germanium 31 is first grown on the p type gallium arsenide 30. Thereafter the center of the layer 31 is masked off so that further growth continues only at the ends **32*a* and 32*b*. On top of the central portion of the layer 31** a thick n type layer of germanium is then grown.

At the respective regions **30, 32*a*, 32*b* and 33, ohmic contacts 34, 35, 36 and 37 are made. In the same manner as the case of the device of FIGURE 1, appropriate biases are applied to the several regions. A potential $-V_2$ is connected to ohmic contact 34 via conductor 38. Ohmic contact 35 is connected to ground by conductor 39 and contact 36 to source of potential $+V_1$ by conductor 40**.

The essential operation of the device of FIGURE 3 is substantially the same as for FIGURE 1 except that layer 31 of germanium has been grown to have an impurity concentration of $10^{14}-10^{16}$ cm.$^3$ and of a thickness on the order of $<10^{-5}$ mm., i.e., smaller than the Debye length at room temperature, to permit ready flow of carriers even with no bias applied at the gate 30.

It will be appreciated that although the foregoing description has been confined to the majority carrier device of FIGURES 1, 2 and 3, involving holes as the majority carriers, the opposite polarity configuration can be realized, that is, all of the regions can have their conductivity type reversed; consequently, the various bias sources will be altered to reflect this difference in conductivity type.

What has been disclosed herein is a novel unipolar field effect device in which, by exploitation of the unique properties of heterojunctions involving two semiconductor materials of differing band gaps, an inversion layer at the heterojunction interface has its conductivity modulated by a control or gate signal.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A majority carrier channel device comprising:

a monocrystalline semiconductor body having at least two regions, the first region being constituted of a first semiconductor material having a first band gap being of predetermined conductivity-type, and a second region of a second different semiconductor having a band gap greater than said first band gap and being of opposite conductivity-type, an inversion layer of opposite conductivity type being created at the narrow surface portion of said first region along the interface between said first and second regions to define a conduction channel, ohmic contact means connected at either end of said channel, and an ohmic contact means connected to said second region which serves as a gate electrode to modulate the conductivity of said channel.

2. A majority carrier channel device comprising:

a monocrystalline semiconductor body having at least two regions, the first region being constituted of a first semiconductor material having a first band gap and being of predetermined conductivity-type, and a second region of a second different semiconductor having a band gap greater than said first band gap and being of opposite conductivity-type, an inversion layer of opposite conductivity-type being created at the narrow surface portion of said first region along the interface between said first and second regions to define a conduction channel, first ohmic contacts at either end of said channel, and a second ohmic contact to at least one of said first and second regions which serves as a gate electrode for said device, biasing means connected to said first ohmic contacts at either end of said channel, and further biasing means connected to said second ohmic contact for modulating the conductivity of said channel.

3. A majority carrier channel device as defined in claim 2 wherein said first region is of germanium and said second region is of gallium arsenide.

4. A majority carrier channel device as defined in claim 2 wherein said first semiconductor material is of n conductivity-type and said second semiconductor material is of p conductivity type.

5. A majority carrier channel device comprising:

a monocrystalline semiconductor body having at least two regions, the first region being constituted of a first semiconductor material having a first band gap and the second region being constituted of a second different semiconductor material having a second wider band gap, each of said first and said second semiconductor materials being of a first conductivity type, ohmic contact means connected at either end of said first region such that said first region defines a conduction channel between said ohmic contact means, and bias means connected to at least one of said first and said second regions to modulate the conductivity of said first region between said ohmic contact means.

6. The majority carrier channel device of claim 5 wherein said first region is of germanium and said second region is of gallium arsenide.

7. The majority carrier channel device of claim 5 wherein at least a portion of said first region intermediate said ohmic contact means has a thickness less than one Debye length.

8. The majority carrier channel device of claim 5 wherein said monocrystalline body includes a third region constituted of said first semiconductor material and being of an opposite conductivity type, at least a portion of said first region intermediate said ohmic contact means being interposed between said second and said third regions.

9. The majority carrier channel device of claim 8 wherein said interposed portion of said first region has a thickness less than one Debye length.

10. The majority carrier channel device of claim 8 wherein said bias means are connected to at least one of said second and said third regions to modulate the conductivity of said first region between said ohmic contact means.

References Cited by the Examiner

UNITED STATES PATENTS

| | | | |
|---|---|---|---|
| 3,062,972 | 11/1962 | Spector et al. | 317—235 |
| 3,072,507 | 1/1963 | Anderson et al. | 317—235 |
| 3,114,867 | 12/1963 | Szekely | 317—234 |
| 3,176,153 | 3/1965 | Bejat et al. | 317—235 |
| 3,184,350 | 5/1965 | Marinace | 317—235 |

OTHER REFERENCES

IBM Technical Disclosure Bulletin, vol. 3, No. 2, July 1960, p. 44.

JOHN W. HUCKERT, *Primary Examiner.*

J. D. KALLAM, *Assistant Examiner.*